(12) United States Patent
Kobayashi (10) Patent No.: US 7,919,916 B2
(45) Date of Patent: Apr. 5, 2011

(54) LIGHT-EMITTING DEVICE AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 339 days.

(21) Appl. No.: 12/193,276

(22) Filed: Aug. 18, 2008

(65) Prior Publication Data

US 2009/0072709 A1  Mar. 19, 2009

(30) Foreign Application Priority Data

Sep. 18, 2007 (JP) ................................ 2007-240537

(51) Int. Cl.
 *H01J 63/04* (2006.01)
(52) U.S. Cl. ......... 313/503; 313/504; 313/505; 313/506
(58) Field of Classification Search .......... 313/495–512; 315/169.3, 169.4; 257/40, 79; 428/690, 428/917; 345/30, 36, 44, 45
See application file for complete search history.

(56) References Cited

U.S. PATENT DOCUMENTS

| 7,218,049 | B2 | 5/2007 | Yamada et al. | |
| 2003/0067266 | A1* | 4/2003 | Kim et al. | 313/504 |
| 2005/0236982 | A1* | 10/2005 | Nakayama et al. | 313/506 |
| 2007/0015429 | A1* | 1/2007 | Maeda et al. | 445/24 |

FOREIGN PATENT DOCUMENTS

| JP | B2-3944906 | 7/2007 |
| WO | WO 01/39554 A1 | 5/2001 |

\* cited by examiner

*Primary Examiner* — Bumsuk Won
*Assistant Examiner* — Elmito Breval
(74) *Attorney, Agent, or Firm* — Oliff & Berridge, PLC (57) ABSTRACT

A light-emitting device includes a light-emitting element having a first electrode layer, a second electrode, a light-emitting functional layer, a reflective layer which reflects light toward the light-emitting functional layer, a translucent semi-reflective layer which reflects some portion of light emitted from the light-emitting functional layer and transmits the rest of light therethrough, and a color filter which transmits light which passed through out the translucent reflective layer. An optical path $d_1$ has a value between $d_{1a}$ calculated by $d_{1a}=(p+1/2)\cdot\lambda/2-(\phi_1-\phi_2)\cdot\lambda/4\pi-n_z\cdot t_z$ and $d_{1b}=m\cdot\lambda/2+(\phi_3+\phi_2)\cdot\lambda/4\pi$.

9 Claims, 7 Drawing Sheets

LIGHT-EMITTING DEVICE AND ELECTRONIC APPARATUS

BACKGROUND

1. Technical Field

The present invention relates to a light-emitting device, which performs light emission by electroluminescence, and an electronic apparatus.

2. Related Art

As thin and lightweight light sources, organic electroluminescent diodes (OLED), i.e. electroluminescent (EL) elements have been paid attention, and image displaying devices equipped with a plurality of light-emitting devices such as OLED have been developed. The light-emitting device generally has a structure in which at least one layer of organic thin film made of organic material is interposed between a pixel electrode and an opposing electrode.

In the field of EL devices, WO-A-01/39554 discloses a technique in which a specific wavelength of emitted light is enhanced by amplifying interference such as resonance. With this technique, it is possible to increase color purity and efficiency of emitted light.

However, such an EL device has a problem in that quality of a displayed image deteriorates thanks to the outdoor daylight reflection at the displaying surface. In order to solve this problem, for example, suggested is a technique in which a circularly polarizing plate is disposed at the displaying surface side. However, such a technique still has a problem like the decrease of luminosity since the circularly polarizing plate decreases light emitted from the light-emitting layer.

In addition, Japanese Patent No. 3944906 discloses a method of decreasing the outdoor daylight reflection by arranging color filters and organic EL elements in an overlapping manner. This method is to absorb wavelengths of light other than specific wavelengths supposed to be transmitted through the color filter. However, in this method which simply employs the color filters, reflection of colors of light different from the light emitted from the organic EL elements is decreased but reflection of colors of light which are the same or similar to colors of light emitted form the light-emitting elements is not decreased.

Moreover, Japanese Patent No. 3944906 discloses a technique in which the phase of reflected light of the outdoor daylight at a translucent electrode of an organic EL element and the phase of reflected light of the outdoor daylight at a reflective electrode are opposite to one another.

As disclosed in Japanese Patent No. 3944906, when the phase of reflected light at one surface and the phase of reflected light at another surface are opposite to one another, the reflected light can be decreased thanks to attenuating interference. However, under such condition, there is a limit especially in increasing efficiency of light emitted during light emission. Japanese Patent No. 3944906 discloses an organic EL element including a translucent electrode and a reflective electrode and the structure of a resonator which resonates light by reciprocating the light between the translucent electrode and the reflective electrode. With even the structure in which light reciprocates between electrodes, it is impossible to increase the light usability without resonance of light when optical factors such as an optical distance are appropriate.

SUMMARY

An advantage of some aspects of the invention is that it provides a light-emitting device and an electronic apparatus which can solve the above problems.

According to one aspect of the invention, there is provided a light-emitting device including a light-emitting element having a first electrode layer, a second electrode, and a light-emitting functional layer disposed between the first electrode and the second electrode layer, a reflective layer which reflects light emitted from the light-emitting functional layer there from toward the light-emitting functional layer, a translucent semi-reflective layer which is disposed at the opposite side of the reflective layer with the light-emitting functional layer there between and which reflects some portion of light emitted from the light-emitting functional layer and transmits the rest of light there through, and a color filter which is disposed at the opposite side of the light-emitting functional layer with the translucent semi-reflective layer there between and transmits light which passed through the translucent semi-reflective layer, in which an optical distance $d_1$ which is a way from the reflective layer to the translucent semi-reflective layer is a value between a $d_{1a}$ calculated by expression 1 and $d_{1b}$ calculated by expression 2, when $d_{1a}=(p+1/2)\cdot\lambda/2-(\phi_1-\phi_2)\cdot\lambda/4\pi-n_z\cdot t_z$ (expression 1), and $d_{1b}=m\cdot\lambda/2+(\phi_3+\phi_2)\cdot\lambda/4\pi$ (expression 2), when $\lambda$ is a wavelength at a peak transmittance of the color filter, $\phi_1$ is a phase change when light of a wavelength $\lambda$, which advances toward the translucent semi-reflective layer from the opposite side of the light-emitting functional layer, reflects from an interface of the translucent semi-reflective layer which is at the opposite side of the light-emitting functional layer, $\phi_2$ is a phase change when the light of a wavelength $\lambda$, which advances toward the reflective layer from the light-emitting functional layer, reflects from the reflective layer, and $\phi_3$ is a phase change when the light of a wavelength $\lambda$, which advances toward the translucent semi-reflective layer from the light-emitting functional layer, reflects from an interface of the transparent semi-reflective layer which is at the light-emitting functional layer side, and when p is a positive integer, m is a positive integer, $n_z$ is a reflectance of the translucent semi-reflective layer with respect to the light of a wavelength $\lambda$ and $t_z$ is a thickness of the translucent semi-reflective layer.

In addition to a resonator structure having a light-emitting element, a translucent semi-reflective layer, and a reflective layer, the light-emitting device according to this aspect further includes a color filter. An optical distance $d_1$, which is a way from the reflective layer to the translucent semi-reflective layer of the light-emitting element having the resonator structure, is a value between a value calculated by expression 1 which shows conditions suited to decrease outdoor daylight reflection and a value calculated by expression 2 which shows conditions suited to increase light usability. That is, it is possible to increase efficiency of light emitted during light emission by setting the optical distance $d_1$ in such a manner.

The optical distance $d_1$ from the reflective layer to the translucent semi-reflective layer may be the average a value $d_{1a}$ calculated by expression 1 and a value $d_{1b}$ calculated by expression 2.

The light-emitting device according to this aspect may further include a plurality of light-emitting elements at which different colors of light pass through the translucent layers, and a plurality of color filters having different peak transmission wavelengths $\lambda$, in which each of the color filters is disposed at a position corresponding to any of the plurality of light-emitting elements, constitutes a set of a light-emitting element and a color filter, and in which an optical distance $d_1$ from the reflective layer to the translucent semi-reflective layer is a value between a value $d_{1a}$ calculated by expression 1 and a value $d_{1b}$ calculated by expression 2 in each set of a light-emitting element and a color filter.

For example, in the light-emitting device equipped with a plurality of light-emitting elements which emits blue, green, and red colors of light, respectively and a plurality of color filters which transmits blue, green, and red colors of light, respectively, the optical distance $d_1$ in a set of a blue color filter and a blue light-emitting element may be an intermediate value, the optical distance $d_1$ in a set of a green color filter and a green light-emitting element may be an intermediate value, and the optical distance $d_1$ in a set of a red color filter and a red light-emitting element may be an intermediate value. With such a structure, it is possible to decrease the outdoor daylight reflection in any of the sets and to increase efficiency of light emitted during light emission.

According to another aspect of the invention, there is provided an electronic apparatus including any of the light-emitting elements.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, various embodiments of the invention will be described with reference to the accompanying drawing. In the drawings, proportions of scales of elements to real scales will be properly determined and may be different.

First Embodiment

Figure 1:
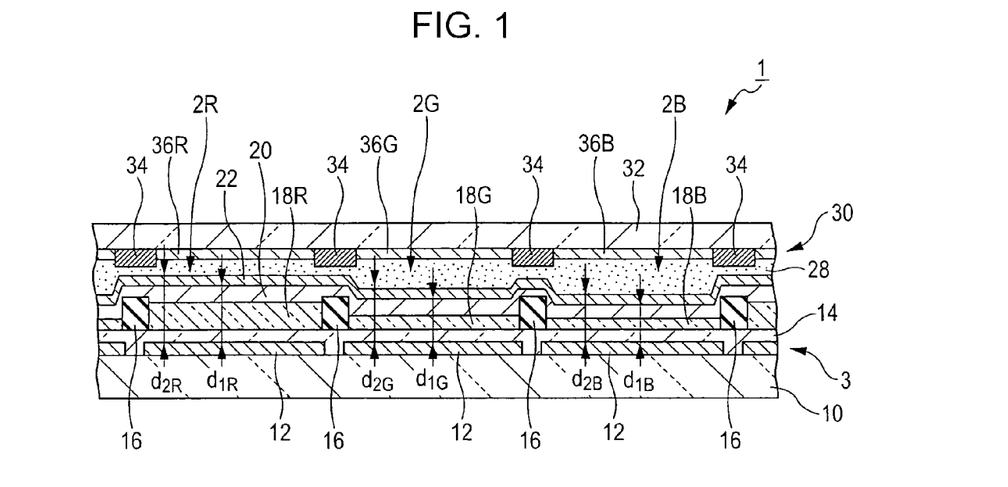
FIG. 1 is a cross-sectional view illustrating the overall structure of a light-emitting device according to a first embodiment of the invention.

FIG. 1 is a cross-sectional view illustrating the overall structure of an organic EL device (light-emitting device) according to a first embodiment of the invention. The organic EL device 1 includes a light-emitting panel 3 and a color filter panel 30.

As shown in FIG. 1, the light-emitting panel 3 includes a plurality of light-emitting elements 2 (pixels 2R, 2G, and 2B). The organic EL device 1 is used as a full-color image displaying device. The light-emitting element 2R is a red light-emitting element which emits red light, the light-emitting element 2G is a green light-emitting element which emits green light, and the light-emitting element 2B is a blue light-emitting element which emits blue light. Although FIG. 1 shows only three light-emitting elements 2, but the light-emitting device may include more light-emitting elements than three as shown in FIG. 1. Hereinafter, suffixes R, G, and B reference the red light-emitting elements 2R, the green light-emitting elements 2G, and the blue light-emitting elements 2B, respectively.

The light-emitting panel 3 shown in FIG. 1 is a top emission type. The light-emitting panel 3 includes a substrate 10. The substrate 10 may be formed of a transparent material such as glass, or may be formed of an opaque material such as ceramic or metal.

A portion of the substrate 10 at which the substrate 10 overlaps with the light-emitting element 2 has a reflective layer 12 having a uniform thickness. The reflective layer 12 is formed of a material having a high reflectance, such as aluminum and silver, and reflects the light directed from the light-emitting element 2 (including light emitted from the light-emitting element 2) in a vertically upward direction of FIG. 1.

An insulating transparent layer 14 is formed on the substrate 10 to cover the reflective layer 12. The insulating transparent layer 14 is formed of an insulating material having high transmittance, such as silicon SiN. Thin film transistors (TFTs) which supply power to the light-emitting elements 2 and wirings are buried in the insulating transparent layer 14. A thickness of the insulating transparent layer 14 formed on the reflective layer 12 is uniform regardless of the colors of light emitted from the light-emitting elements 2 which are overlapped.

Sectors 16 demarcating the light-emitting elements 2 from each other are formed on the insulating transparent layer 14. The sectors 16 are made of insulating resin, such as epoxy and polyimide.

Each of the light-emitting elements 2 includes a first electrode layer 18, a second electrode layer 22, and a light-emitting functional layer 20 disposed between the first electrode layer 18 and the second electrode layer 22. With this embodiment, the first electrode layers 18 (18R, 18G, and 18B) are pixels electrodes provided in pixels (light-emitting elements 2), respectively, and are positive electrodes. The first electrode layers 18 are formed of a transparent material, such as indium tin oxide (ITO) and $ZnO_2$. The first electrode layers 18 have different thicknesses according to emission colors. That is, the first electrode layers 18R, 18G, and 18B have different colors from each other.

With this embodiment, the light-emitting functional layer 20 is a common layer for every light-emitting element 2. That is, it has a uniform thickness regardless of the emission colors of the light-emitting elements 2. The light-emitting functional layer 20 has at least an organic light-emitting layer. The organic light-emitting layer emits white color of light when current flows. That is, it emits the light containing red, green, and blue components. The organic light-emitting functional layer can be a single layer or may be a structure consisted of a plurality of layers (for example, a blue emission layer which emits mainly blue light, a red emission layer which mainly emits red light, and a green emission layer which mainly emits greet light, when current flows), While not shown in FIG. 1, besides the organic light-emitting layer, the light-emitting functional layer 20 may include a hole transporting layer, a hole injecting layer, an electron blocking layer, a hole blocking layer, an electron transporting layer, and an electron injecting layer. In the case in which each of the light-emitting layers 20 consists of a plurality of layers, they have an identical thickness regardless of the emission colors of the light-emitting elements 2.

The second electrode layer (translucent semi-reflective layer) 22 is made of a translucent metal or a translucent metallic material, such as MgAl, MgCu, MgAu, and MgAg. With this embodiment, the second electrode layer 22 is a common layer for a plurality of pixels (light-emitting elements), and is a negative electrode. The second electrode layer 22 has a uniform thickness regardless of emission colors of the light-emitting elements 2. The second electrode layer 22 allows some portion of the light directed from the light-emitting functional layer 20 (including the light emitted from the light-emitting layers 20) to pass therethrough in a vertically upward direction of FIG. 1, and reflects the rest of the light toward the first electrode layers 18 in a vertically downward direction of FIG. 1.

In openings (pixel apertures) formed in the sectors 16, when current flows between the first electrode 18 and the second electrode 22 in a certain light-emitting element 2, the light-emitting functional layer 20 is in contact with the first electrode layer 18, holes are supplied to the light-emitting function layer 20 from the first electrode layer 18, electrodes are supplied to the light-emitting functional layer 20 from the second electrode layer 22, and light emission occurs as the holes and the electrons are combined in the light-emitting element 2 in which the current flows. Accordingly, a light emission area in the pixel aperture formed in the sector 16 is determined. That is, the pixel aperture of the sector 16 demarcates the light-emitting element 2.

Figure 2:
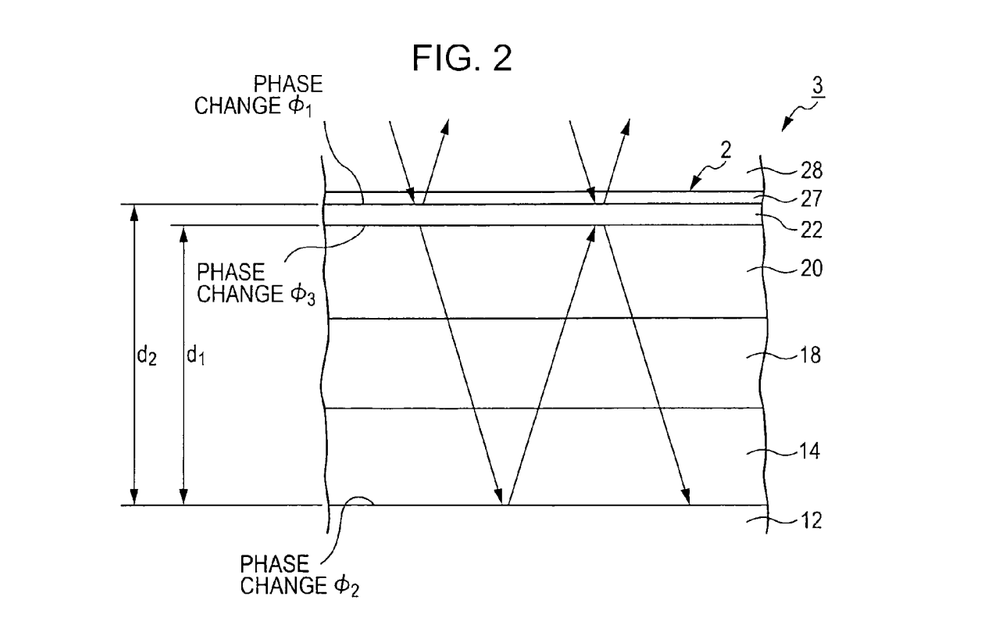
FIG. 2 is a schematic view illustrating the trace of light while the outdoor daylight passes through a color filter and reaches a light-emitting element of a light-emitting panel in the light-emitting device shown in FIG. 1.

As only shown in FIG. 2, a passivation layer 27 which is very thin is formed on the surface of the second electrode layer 22 in the figure. The passivation layer 27 is formed of an inorganic material, which is transparent, such as SiON and prevents the light-emitting elements 2, and in particular the light-emitting functional layer 20 from deteriorating by oxygen or moisture. In this manner, the light-emitting panel 3 is formed.

The light-emitting functional layer 20 performs white emission but each of the light-emitting element 2 emits light in which a predetermined wavelength is amplified by reciprocating the light generated by the white emission between the reflective layer 12 and the second electrode layer 22. That is, the light mainly containing a wavelength corresponding to red is amplified in and emitted from the light-emitting element 2R, the light mainly containing a wavelength corresponding to green is amplified in and emitted from the light-emitting element 2G, and the light mainly containing blue is amplified in and emitted from the light-emitting element 2B. Accordingly, optical distances $d_1$ ($d_{1R}$, $d_{1G}$, and $d_{1B}$) between the reflective layers 12 and the second electrode layers 22 in the light-emitting elements 2R, 2G, and 2B are different from each other. Further, $d_1$ ($d_{1R}$, $d_{1G}$, and $d_{1B}$) and $d_2$ ($d_{2R}$, $d_{2G}$, and $d_{2B}$) in the figure mean optical distances but does not mean real distances.

A color filter panel 30 is bonded to the light-emitting panel 3 by a transparent adhesive 28. The color filter panel 30 includes a base plate 32 formed of a transparent material, such as glass, a black matrix 34 formed on the base substrate, and color filters 36 (36R, 36G, 26B) arranged in apertures formed in the black matrix 34. The adhesive 28 is disposed between the color filter 36 of the color filter panel 30 and the passivation layer 27 (see FIG. 2) of the light-emitting panel 3 and supports the base plate 32 and the color filters 36 of the color filter panel to be in parallel with layers of the light-emitting panel 3.

The color filters 36 are arranged at locations where they overlap with the light-emitting elements 2, and in particular the first electrode layers 1B. The color filter 36 is disposed at the opposite side of the light-emitting functional layer 20 with the second electrode layer 22 which is a translucent layer therebetween, and transmits the light which passed out the second electrode layer 22 of the overlapped light-emitting element 2. Hereinafter, this will be described in detail below.

The color filters 36R overlap with the light-emitting elements 2R, and one color filter 36R and the one light-emitting element 2R constitutes one set. The color filter 36R functions to transmit red light, and a transmittance peak wavelength which is a wavelength at the peak transmittance is 610 nm. The color filter 36R transmits red light of light components including amplified red light, which passed out the second electrode layer 22 of the overlapped light-emitting element 2R, and increases purity of red. The color filter 36R absorbs green light and blue light.

The color filters 36G are disposed to overlap with the light-emitting elements 2G, respectively, and one color filter 36G and one light-emitting element 2G constitutes one set. The color filter 36G functions to transmit green light and a transmittance peak wavelength is 520 nm. The color filter 36G functions to transmit green light of the light components which passed through the second electrode layer 22 of the overlapped light-emitting element 2G and in which a green light component is amplified, and increases purity of green. The color filter 36G absorbs red light and blue light.

The color filters 36B overlap with the light-emitting elements 2B, respectively, and one color filter 36B and one light-emitting element 2B constitutes one set. The color filter 36B functions to transmit blue light and a transmission peak wavelength thereof is 470 nm. The color filter 36B overlaps with the light-emitting element 2B, transmits blue light of light components which passed through the second element layer 22 of the light-emitting element 2B and in which a blue light component is amplified, and increases purity of blue. The color filter 36B absorbs red light and green light.

FIG. 2 is a schematic view illustrating the trace of light when the outdoor daylight passes through the color filter 36 and reaches the light-emitting elements 2 of the light-emitting panel 3. The outdoor daylight passed through the color filter 36 penetrates the passivation layer 27 through the transparent adhesive 28, and reaches the second electrode layers 22 which are translucent layers 22. Some portion of the outdoor daylight is reflected from an interface between the passivation layer 27 and the second electrode layers 22 (an interface at the opposite side of the second electrode layers 22 of the light-emitting functional layers 20). A phase change caused by the reflection is defined as $\phi_1$.

The rest of the outdoor daylight passes through the second electrode layer 22 which is a translucent layer, passes through the light-emitting functional layer 20, the first electrode layer 18, and the insulating transparent layer 14, and is reflected from the surface of the reflective layer 12 which is near the light-emitting functional layer 20. A phase change during this reflection is defined as $\phi_2$. The reflected light from the reflective layer 12 passes through the insulating transparent layer 14, the first electrode layer 18, and the light-emitting functional layer 20, some portion of the reflected light advances to the adhesive 28 from the light-emitting element 2, passing through the second electrode layer 22 which is a reflective layer and interferes with the reflected light from the interface between the passivation layer 27 and the second electrode layer 22. In FIG. 2, the change of optical path attributable to refraction at the interface is not shown, but the optical path is shown in a straight line.

In order to decrease the reflected light at the interfaces by the attenuating interference, it is preferable that expression 3 is satisfied;

$$\text{here } 2 \cdot d_2 = (p+1/2) \cdot \lambda - (\phi_1 - \phi_2) \cdot \lambda / 2\pi \qquad \text{expression 3,}$$

wherein $d_2$ is an optical distance (nm) between the interface of the reflective layer 12, which is near the light-emitting functional layer 20 and the interface of the second electrode layer 22 which is opposite side surface of the light-emitting functional layer 20. The optical distance $d_2$ is the sum of the product of a refractive index and a thickness of the insulating transparent layer 14, the product of a refractive index and a thickness of the second electrode layer 22, and the product of a refractive index and a thickness of a layer between the insulating transparent layer 14 and the second electrode layer 22.

In expression 3, $\lambda$ is a wavelength (nm) of a light component which is supposed to be attenuated. Since the troublesome outdoor daylight penetrates the color filter 36 and advances toward the light-emitting panel 3, the light is a light component in a transmission wavelength range of the color filter 36. Accordingly, $\lambda$ of expression 3 is set to be a wavelength corresponding to the peak of transmittance of the color filter.

$\phi_1$ of expression 3 is a phase change (rad) when the light, having a wavelength $\lambda$ and directed toward the second electrode layer 22 from the opposite side of the light-emitting functional layer 20, is reflected from the interface which is at the opposite side of the light-emitting functional layer 20 of the second electrode layer 22 which is a translucent layer, and $\phi_2$ is a phase change (rad) when the light, having a wavelength $\lambda$ and directed toward the reflective layer 12 from the light-emitting functional layer 20, is reflected from the reflective layer 12. Further, p is a positive integer and may be preferably 1.

Expression 3 can be rewritten into expression 4;

$$d_2 = (p+1/2) \cdot \lambda/2 - (\phi_1 - \phi_2) \cdot \lambda/4\pi \qquad \text{expression 4.}$$

For each of the light-emitting elements 2R, 2G, and 2B, expression 4 can be written into expressions 5 to 7, respectively $$d_{2R} = (p+1/2) \cdot \lambda_R/2 - (\phi_{1R} - \phi_{2R}) \cdot \lambda_R/4\pi \qquad \text{expression 5,}$$

here, $d_{2R}$ is an optical distance $d_2$ in the light-emitting element 2R, $\lambda_R$ is a wavelength (610 nm) corresponding to the peak transmittance of the color filter 36R, and $\phi_{1R}$ is $\phi_1$ when a wavelength is $\lambda_R$, $\phi_{2R}$ is $\phi_2$ when a wavelength is R $$d_{2G} = (p+1/2) \cdot \lambda_G/2 - (\phi_{1G} - \phi_{2G}) \cdot \lambda_G/4\pi \qquad \text{expression 6,}$$

here, $d_{2G}$ is an optical distance $d_2$ in the light-emitting element 2G, $\lambda_G$ is a wavelength (520 nm) corresponding to the peak transmittance of the color filter 36G, and $\phi_{1G}$ is $\phi_1$ when a wavelength is $\lambda$G, $\phi_{2G}$ is $\phi_2$ when a wavelength is $\lambda_G$.

$$d_{2B} = (p+1/2) \cdot \lambda_B/2 - (\phi_{1B} - \phi_{2B}) \cdot \lambda_B/4\pi \qquad \text{expression 7,}$$

here, $d_{2B}$ is an optical distance $d_2$ in the light-emitting element 2B, $\lambda_B$ is a wavelength (470 nm) corresponding to the peak transmittance of the color filter 36B, and $\phi_{1B}$ is $\phi_1$ when a wavelength is $\lambda_B$, $\phi_{2B}$ is $\phi_2$ when a wavelength is $\lambda_B$.

The optical distance $d_1$ between the reflective layer 12 and the second electrode layer 22 and the optical distance $d_2$ (nm) between the interface between the reflective layer 12 and the light-emitting functional layer 20 and the interface between the second electrode layer 22 and the light-emitting functional layer 20 is in the relationship shown in expression 8.

$$d_1 = d_2 - n_z \cdot t_z \qquad \text{expression 8}$$
$$= (p+1/2) \cdot \lambda/2 - (\varphi_1 - \varphi_2) \cdot \lambda/4\pi - n_z \cdot t_z,$$

here, $n_z$ is a refractive index of the second electrode layer 22 with respect to the light having a wavelength $\lambda$, and $t_z$ is a thickness of the second electrode layer 22.

Accordingly, expression 8 can be rewritten into expressions 9 to 11 for the light-emitting elements 2R, 2G, and 2B, respectively, $$d_{1R} = (p+1/2) \cdot \lambda_R/2 - (\phi_{1R} - \phi_{2R}) \cdot \lambda_R/4\pi - n_{zR} \cdot t_z \qquad \text{expression 9,}$$

here, $d_{1R}$ is an optical distance $d_1$ in the light-emitting element 2R, and $n_{zR}$ is a refractive index $n_Z$ of the second electrode layer 22 with respect to the light having a wavelength $\lambda_R$.

$$d_{1G} = (p+1/2) \cdot \lambda_G/2 - (\phi_{1G} - \phi_{2G}) \cdot \lambda_G/4\pi - n_{zG} \cdot t_z \qquad \text{expression 10,}$$

here, $d_{1G}$ is an optical distance $d_1$ in the light-emitting element 2G, and $n_{zG}$ is a refractive index $n_Z$ of the second electrode layer 22 with respect to the light having a wavelength $\lambda_G$.

$$d_{1B} = (p+1/2) \cdot \lambda_B/2 - (\phi_{1B} - \phi_{2B}) \cdot \lambda_B/4\pi - n_{zB} \cdot t_z \qquad \text{expression 11,}$$

here, $d_{1B}$ is an optical distance $d_1$ in the light-emitting element 2B, and $n_{zB}$ is a refractive index $n_Z$ of the second electrode layer 22 with respect to the light having a wavelength $\lambda_B$. In the above, conditions suited to decrease light reflection at each interface by the attenuating interference are described.

On the other hand, in order to enhance a desired wavelength of light exiting from the color filter 36 through the second electrode layer 22 while the light-emitting element 2 performs light emission by amplifying interference (resonance), it is preferable that the following expression 12 be satisfied;

$$d_1 = m \cdot \lambda/2 + (\phi_3 + \phi_2) \cdot \lambda/4\pi \qquad \text{expression 12,}$$

here, $\lambda$ is a wavelength (nm) of a light component which is desired to be amplified, Light generated by emission of the light-emitting element 2 exits penetrating the color filter 36, as $\lambda$ in expression 12, a wavelength corresponding to the peak transmittance of the color filter may be chosen.

φ₃ in expression 12 is a phase change (rad) when the light, having a wavelength λ and directed toward the second electrode layer 22, which is a translucent layer, from the light-emitting functional layer 20, is reflected from the interface between the second electrode layer 22 and the light-emitting functional layer 20, and m is a positive integer, and preferably be 1.

For the light-emitting elements 2R, 2G, and 2B, expression 12 can be rewritten into expressions 13 to 15, respectively;

$$d_{1R} = m \cdot \lambda_R/2 + (\phi_{3R} + \phi_{2R}) \cdot \lambda_R/4\pi \quad \text{expression 13,}$$

here, $\phi_{3R}$ is $\phi_3$ when a wavelength is $\lambda_R$.

$$d_{1G} = m \cdot \lambda_G/2 + (\phi_{3G} + \phi_{2G}) \cdot \lambda_G/4\pi \quad \text{expression 14,}$$

here, $\phi_{3G}$ is $\phi_3$ when a wavelength is $\lambda_G$.

$$d_{1B} = m \cdot \lambda_B/2 + (\phi_{3B} + \phi_{2B}) \cdot \lambda_B/4\pi \quad \text{expression 15,}$$

here, $\phi_{3B}$ is $\phi_3$ when a wavelength is $\lambda_B$. In the above, conditions suited to enhance the light having a desired wavelength of the light components emitted from the light-emitting element 2 by amplifying interference are described.

With this embodiment, in order to decrease the outdoor daylight reflection and increase efficiency of the light having a desired wavelength, the optical distance $d_1$ between the reflective layer 12 and the second electrode layer 22 is set to an intermediate value between a value $d_1$ (called $d_{1a}$) obtained by the expression 8 and a value $d_1$ (called $d_{1b}$) obtained by the expression 12. Accordingly, for the light-emitting element 2R, the optical distance $d_{1R}$ is set to be an intermediate value between a value $d_{1R}$ obtained by expression 9 and a value $d_{1R}$ obtained by expression 13. As for the light-emitting element 2G, the optical distance $d_{1G}$ is set to be an intermediate value between a value $d_{1G}$ obtained by expression 10 and a value $d_{1G}$ obtained by expression 14. As for the light-emitting element 2B, the optical distance $d_{1B}$ is set to be an intermediate value between a value $d_{1B}$ obtained by expression 11 and a value $d_{1B}$ obtained by expression 15.

Simulation Result According to First Embodiment

Hereinafter, the simulation result and the structure of the first embodiment will be described along with detailed materials and parameters. In this simulation, an optical simulation program "product name: OptDesigner" manufactured by Toyota Central R&D Labs., Inc is used, but it is assumed that the same result will be obtained even when other simulation programs are used.

Simulation Result According to First Comparative Example

First, the first comparative example which is best suited to the increase efficiency of light having a desired wavelength is obtained by simulation. In this simulation, materials for every layer are carefully selected, and the optical characteristics of the selected materials are put into a simulation program. Then, a thickness of each layer is obtained such that a light component having a wavelength $\lambda_R$ (610 nm) of the light from the light-emitting element 2R, a light component having a wavelength $\lambda_G$ (520 nm) of the light from the light-emitting element 2G, and a light component having a wavelength $\lambda_B$ (470 nm) of the light from the light-emitting element 2B become to the maximum. In this simulation, each of a thickness of the insulating transparent layer 14, a thickness of the light-emitting function layer 20, and a thickness of the second electrode layer 22 is uniform in the light-emitting elements 2R, 2G, and 2B, but a thickness of the first electrode layer 18 is set to vary according to the kinds of the light-emitting elements 2R, 2G, and 2B.

Table 1 shows materials and parameters of layers used in the first comparative example. As shown in table 1, when a SiN layer is used as the insulating transparent layer 14 in common for the light-emitting elements 2R, 2G, and 2B, the thickness of the SiN layer is calculated to 90 nm by the simulation. This thickness means a thickness of a portion associated with the optical distance $d_1$, i.e. a thickness of a portion at which the insulating transparent layer 14 overlaps with the reflective layer 12.

TABLE 1

| | | Thickness t (nm) | | | Refractive index n | | |
| --- | --- | --- | --- | --- | --- | --- | --- |
| | Material | Light-emitting element 2R | Light-emitting element 2G | Light-emitting element 2B | At a wavelength of $\lambda_R$ | At a wavelength of $\lambda_G$ | At a wavelength of $\lambda_B$ |
| Insulating transparent layer 14 | SiN | 90 | 90 | 90 | 1.87 | 1.88 | 1.89 |
| First electrode layer 18 | ITO | 108 | 64.8 | 27 | 1.89 | 1.97 | 2.03 |
| Light-emitting functional layer 20 | Organic light-emitting material | 94 | 94 | 94 | 1.8 | 1.83 | 1.86 |

When using ITO as the first electrode layer 18, according to the simulation result, a thickness of the first electrode layer 18R of the light-emitting element 2R is 108 nm, a thickness of the first electrode layer 18G of the light-emitting element 2G is 64.8 nm, and a thickness of the first electrode layer 18B of the light-emitting element 2B is 27 nm.

When using an organic light-emitting material as the light-emitting functional layers for the light-emitting elements 2R, 2G, and 2B, according to the simulation result, a thickness of the light-emitting functional layers 20 is 94 nm. The thickness is a thickness of a portion of the light-emitting functional layer which overlaps with the first electrode layer 18.

Table 1 also shows refractive indexes. The refractive indexes depend on wavelengths. The refractive indexes in table 1 are measured when the wavelength λR is 610 nm, the wavelength $\lambda_G$ is 520 nm, the wavelength $\lambda_B$ is 470 nm. For example, a refractive index of the first electrode layer 18 is 1.89 when the wavelength is $\lambda_R$, a refractive index of the first electrode layer 18 is 1.97 when the wavelength is $\lambda_G$, and a refractive index of the first electrode layer is 2.03 when the wavelength is $\lambda_B$.

The optical distance $d_1$ between the reflective layer 12 and the second electrode layer 22 is calculated by the sum of the product of a thickness and a refractive index of the insulating transparent layer 14, the product of a thickness and a refractive index of the first electrode layer 18, and the product of a thickness and a refractive index of the light-emitting functional layer 20. According to the calculation, the optical distance $d_{1R}$ of the light-emitting element 2R is 541.620 nm, the optical distance $d_{1G}$ of the light-emitting element 2G is 468.876 nm, and the optical distance $d_{1B}$ of the light-emitting device 2B is 399.750 nm.

The optical distances $d_{1R}$, $d_{1G}$, and $d_{1B}$ suited to increase usability of light having a desired wavelength can be calculated by expressions 13 to 15. Table 2 shows parameters which must be put into expressions 13 to 15. As the second electrode layer 22 relating to $\phi_3$ ($\phi_{3R}$, $\phi_{3G}$, $\phi_{3B}$), MgAg alloy (a ratio of Mg:Ag is 1:10) of 12.5 nm in thickness is used. This thickness is a thickness of a portion of the second electrode layer which overlaps with the first electrode layer 18.

TABLE 2

| | Light-emitting element 2R | Light-emitting element 2G | Light-emitting element 2B |
| --- | --- | --- | --- |
| Wavelength λ to be amplified | $\lambda_R = 610$ | $\lambda_G = 520$ | $\lambda_B = 470$ |
| Phase change $\phi_3$ | $\phi_{3R} = 2.34$ | $\phi_{3G} = 2.22$ | $\phi_{3B} = 2.15$ |
| Phase change $\phi_2$ | $\phi_{2R} = 2.51$ | $\phi_{2G} = 2.41$ | $\phi_{2B} = 2.33$ |
| Integer m | m = 1 | m = 1 | m = 1 |

Calculation is performed by putting the parameters of table 2 into expression 13 and 15. According to the calculations of expressions 13 to 15, the optical distance $d_{1R}$ of the light-emitting element 2R is 540.430 nm, the optical distance $d_{1G}$ of the light-emitting element 2G is nm, and the optical distance $d_{1B}$ of the light-emitting element 2B is 402.558 nm. In this manner, the optical distances $d_{1R}$, $d_{1G}$, and $d_{1B}$ obtained by the simulation are almost the same as the optical distances obtained by expressions 13 to 15.

Reflectance at the front surface of the light-emitting panel 3 is calculated by the simulation by setting conditions of the insulating transparent layer 14, the first electrode layer 18, the light-emitting functional layer 20, and the second electrode layer 22 in the above described manner. This reflectance is a ratio of intensity of light when the reflected light penetrated the color filter 36 to intensity of original isoenergetic white light.

Figure 3:
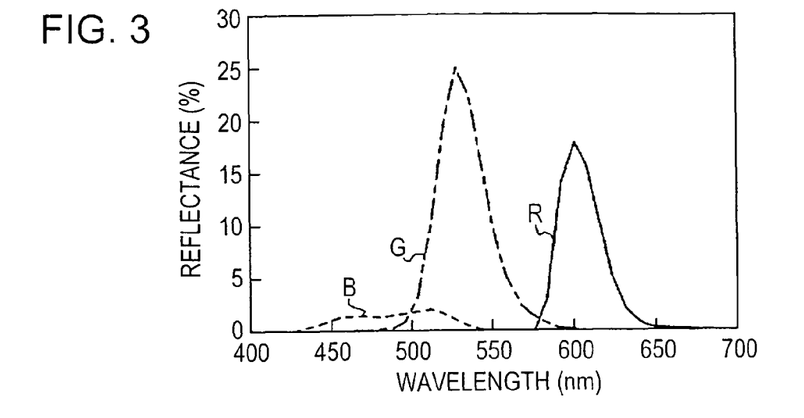
FIG. 3 is a graph illustrating the simulation result of reflectance at the front surface (incident angle is 0°) of a light-emitting panel which is a comparative example relating to the first embodiment.

FIG. 3 is a graph showing the simulation result of a refractive index at the front surface (at an angle of 0°) of the light-emitting panel 3 of the first comparative example. In FIG. 3, a curved line R shows reflectance associated with the light-emitting element 2R and the color filter 36R, a curved ling G shows reflectance associated with the light-emitting element 2G and the color filter 36G, and a curved line B shows reflectance associated with the light-emitting element 2B and the color filter 36B. The first comparative example is suited to increase usability of light having a desired wavelength but is not calculated to decrease the reflectance. Accordingly, in the first comparative example, the reflectance (curved line R) with respect to the light-emitting element 2R and the color filter 36R and the reflectance (curved line G) with respect to the light-emitting element 2G and the color filter 36G are high.

The luminous efficacy reflectance which is a comprehensive reflectivity for a plurality of light-emitting elements 2 shown through the color filters 36 can be obtained by integral calculus of the graph of FIG. 3 at the front surface (an incident angle is 0°) of the light-emitting panel 3. The calculus shows the luminous efficacy reflectance of 5.17%.

Besides the outdoor daylight reflection from the front surface, reflection at other incident angels must be taken into consideration. Here, when an incident angle is 45°, the reflectance of the light-emitting panel 3 is calculated by the simulation. The simulation conditions of the embodiment are the same as set in the simulation in which an incident angle of 0°. The reflectance is a ratio of intensity of light when isoenergetic white light penetrates through the color filter 36 and reaches the light-emitting panel 3 and the reflected light thereof penetrates back through the color filter 36, to intensity of the original isoenergetic white light.

Figure 4:
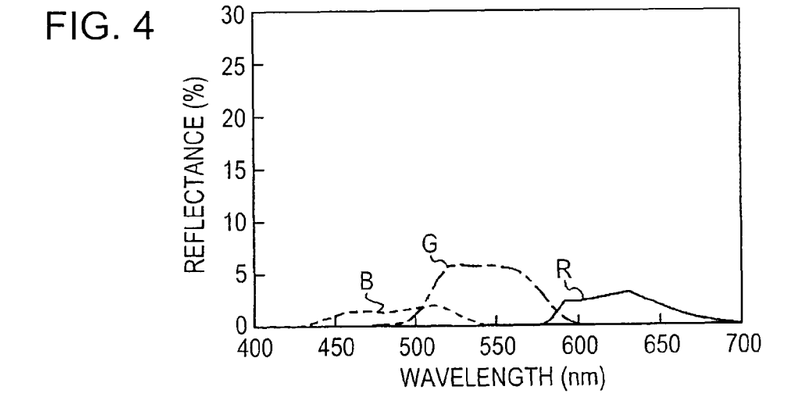
FIG. 4 is a graph illustrating the simulation result of reflectance of a light emitting panel 3 when an incident angle in the first comparative example is 45°.

FIG. 4 is a graph illustrating the simulation result of the reflectance of the light-emitting panel 3 when an incident angle is 45° (first comparative example). In FIG. 4, the curved line R shows the reflectance associated with the light-emitting element 2R and the color filter 36R, the curved line G shows the reflectance associated with the light-emitting element 2G and the color filter 36G, and the curved line B shows the reflectance associated with the light-emitting element 2B and the color filter 36B.

The luminous efficacy reflectance shown through the color filter 36 is obtained by integral calculus of the graph of FIG. 4 when the light is inclined to the light-emitting panel 3 at an angle of 45° (incident angle of 45°). The luminous efficacy reflectance is calculated to 2.55%. In the first comparative example, the average of the luminous efficacy reflectance at an incident angle of 0° and the luminous efficacy reflectance at an incident angle of 45° is 3.86%.

Simulation Result of Second Comparative Example

Next, a second comparative example suited to decrease the outdoor daylight reflection is obtained by simulation. In this simulation, each of a thickness of the insulating transparent layer 14, a thickness of the light-emitting functional layer 20, and a thickness of the second electrode layer 22 is uniform in the light-emitting elements 2R, 2G, and 2B. Further, the thicknesses are uniform in the first comparative example. However, the thickness of the first electrode layer 18 is different for light-emitting elements 2R, 2G, and 2B. In this simulation, the thicknesses of the first electrode layers 18R, 18G, and 18B in the light-emitting elements 2R, 2G, and 2B and the thickness of the second electrode layer 22 which is a translucent layer and is uniform in the light-emitting elements 2R, 2G, and 28 are set such that a light component having a wavelength $\lambda_R$ (610 nm) of the light reflected from the light-emitting element 2R, a light component having a wavelength $\lambda_G$ (520 nm) of the light reflected from the light-emitting element 2G, and a light component having a wavelength $\lambda_B$ (470 nm) of the light reflected from the light-emitting element 2B are decreased to the minimum.

Table 3 shows materials and parameters of layers according to the second comparative example. Parameters associated with the insulating transparent layer 14 and the light-emitting functional layer 20 are the same as in Table 1.

TABLE 3

| | Material | Thickness t (nm) Light-emitting element 2R | Thickness t (nm) Light-emitting element 2G | Thickness t (nm) Light-emitting element 2B | Refractive index n At a wavelength of $\lambda_R$ | Refractive index n At a wavelength of $\lambda_G$ | Refractive index n At a wavelength of $\lambda_B$ |
|---|---|---|---|---|---|---|---|
| Insulating transparent layer 14 | SiN | 90 | 90 | 90 | 1.87 | 1.88 | 1.89 |
| First electrode layer 18 | ITO | 86.4 | 43.2 | 27 | 1.89 | 1.97 | 2.03 |
| Light-emitting functional layer 20 | Organic light-emitting material | 94 | 94 | 94 | 1.8 | 1.83 | 1.86 |
| Second electrode layer 22 | MgAg | 12.5 | 12.5 | 12.5 | 1.232 | 1.4042 | 1.6989 |

When using ITO as the first electrode layer 18, the thickness of the first electrode layer 18R of the light-emitting element 2R, the thickness of the first electrode layer 18G of the light-emitting element 2G, and the thickness of the first electrode layer 18B of the light-emitting element 2B are calculated to 86.4 nm, 43.2 nm, and nm, respectively by the simulation.

When using MgAg as the second electrode layer 22 which is shared by the light-emitting elements 2R, 2G, and 2B, the thickness of the second electrode layer is calculated to 12.5 nm by the simulation. The thickness is a thickness of some portion associated with the optical distance $d_2$, i.e. a thickness of some portion of the second electrode layer, the portion overlapping with the first electrode layer 18. As described above, $t_z$ of expressions 8 to 11 is a thickness of the second electrode layer 22.

As shown in table 3, a refractive index ($n_{zR}$ of expression 9) of the second electrode layer 22 is 1.232 when a wavelength $\lambda_R$ is 610 nm, a refractive index ($n_{zG}$ of expression 10) of the second electrode layer 22 is 1.4042 when a wavelength $\lambda_G$ is 520 nm, and a refractive index ($n_{zB}$ of expression 11) of the second electrode layer 22 is 1.68989 when a wavelength $\lambda_B$ is 470 nm.

The optical distance $d_2$ between the interface of the reflective layer 12 which is at the light-emitting functional layer 20 side and the interface of the second electrode layer 22 which is at the opposite side of the light-emitting functional layer 20 is calculated by the sum of the product of a thickness and a refractive index of the insulating transparent layer 14, the product of a thickness and a refractive index of the first electrode layer 18, the product of a thickness and a refractive index of the light-emitting functional layer 20, and the product of a refractive index and a thickness of the second electrode layer 22. According to this calculus, the optical distance $d_{2R}$ of the light-emitting element 2R is 516.196 nm, the optical distance $d_{2G}$ of the light-emitting element 2G is 443.877 nm, and the optical distance $d_{2B}$ of the light-emitting element 2B is 420.986 nm.

Further, the optical distance $d_1$ between the reflective layer 12 and the second electrode layer 22 is calculated by the sum of the product of a thickness and a refractive index of the insulating transparent layer 14, the product of a thickness and a refractive index of the first electrode layer 18, and the product of a thickness and a refractive index of the light-emitting functional layer 20. According to this calculus, the optical distance $d_{1R}$ of the light-emitting element 2R is 500.796 nm, the optical distance $d_{1G}$ of the light-emitting element 2G is 426.324 nm, and the optical distance $d_{1B}$ of the light-emitting element 2B is 399.750 nm.

The optical distances $d_{2R}$, $d_{2G}$, and $d_{2B}$ suited to decrease the reflected light of a desired wavelength at each interface by attenuating interference can be calculated by expressions 5 to 7, and the optical distances $d_{1R}$, $d_{1G}$, and $d_{1B}$ suited to decrease the reflected light of a desired wavelength at each interface by attenuating interference can be calculated by expressions 9 to 11. Parameters which should be put into expressions 5 to 11 are shown in table 4.

TABLE 4

| | Light-emitting element 2R | Light-emitting element 2G | Light-emitting element 2B |
|---|---|---|---|
| Wavelength $\lambda$ to be attenuated | $\lambda_R = 610$ | $\lambda_G = 520$ | $\lambda_B = 470$ |
| Phase change $\phi_1$ | $\phi_{1R} = 2.33$ | $\phi_{1G} = 2.2$ | $\phi_{1B} = 2.12$ |
| Phase change $\phi_2$ | $\phi_{2R} = 2.51$ | $\phi_{2G} = 2.41$ | $\phi_{2B} = 2.33$ |
| Integer p | p = 1 | p = 1 | p = 1 |
| Thickness $t_2$ of second electrode layer 22 | $t_z = 12.5$ | $t_z = 12.5$ | $t_z = 12.5$ |
| Refractive index $n_z$ of second electrode layer 22 | $n_{zR} = 1.232$ | $n_{zG} = 1.4042$ | $n_{zB} = 1.6989$ |

The calculation is performed by properly putting the parameters of table 4 into expressions 5 to 11. According to the calculation based on expressions 5 to 7, the optical distance $d_{2R}$ of the light-emitting element 2R is 466.238 nm, the optical distance $d_{2G}$ of the light-emitting element 2G is nm, and the optical distance $d_{2B}$ of the light-emitting element 2B is 360.354 nm. According to the calculus based on expressions 8 to 11, the optical distance $d_{1R}$ of the light-emitting element 2R is 450.838 nm, the optical distance $d_{1G}$ of the light-emitting element 2G is 381.137 nm, and the optical distance $d_{1B}$ of the light-emitting element 2B is 339.118 nm.

The optical distances $d_{1R}$, $d_{1G}$, and $d_{1B}$ obtained by the simulation and the optical distances obtained by expressions 8 to 11 are different from one another by 45 to 60 nm. It is considered that such difference is attributable to reflection at other interfaces which are not taken into consideration in expressions 8 to 11.

In this manner, the reflectance at the front surface of the light-emitting panel 3 is calculated by simulation in the same manner as the first comparative example by setting the condition in association with the insulating transparent layer 14, the first electrode layer 18, the light-emitting functional layer 20, and the second electrode layer 22.

Figure 5:
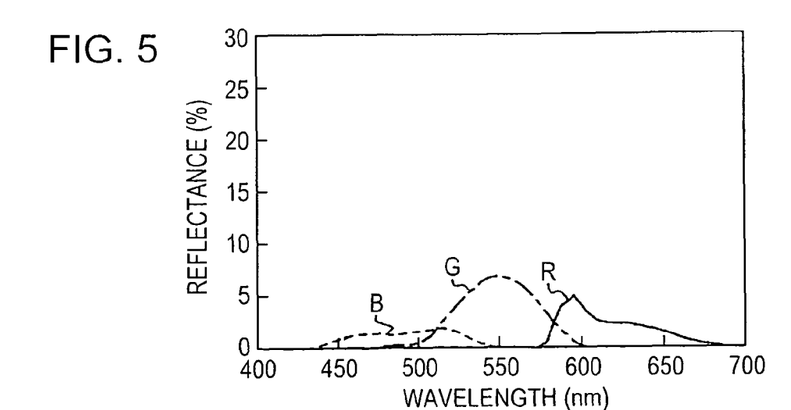
FIG. 5 is a graph illustrating the simulation result of reflectance at the front surface (incident angle is 0°) of a light-emitting panel according to a second comparative example relating to the first embodiment.

FIG. 5 is a graph showing the simulation result of the reflectance at the front surface (incident angle is 0°) of the light-emitting panel 3 of the second comparative example. In FIG. 5, the curved line R shows the reflectance associated with the light-emitting element 2R and the color filter 36R, the curved line G shows the reflectance associated with the light-emitting element 2G and the color filter 36G, and the curved line B shows the reflectance associated with the light-emitting element 2B and the color filter 36B. Since the second comparative example is calculated in order to decrease the reflectance, the reflectance (curved line R) associated with the light-emitting element 2R and the color filter 36R and the reflectance (curved line G) associated with the light-emitting element 2G and the color filter 36G are lower than the first comparative example of FIG. 3.

The luminous efficacy reflectance which is a reflectance when a plurality of light-emitting elements 2 is comprehensively shown through a plurality of color filters 36 thereon is obtained by performing integral calculus of the graph of FIG. 5 at the front surface (incident angle is 0°) of the light-emitting panel 3. The luminous efficacy reflectance is calculated to 2.69%.

When taking the outdoor daylight reflection into considerations besides the outdoor daylight from the front surface, light reflection at other incident angles must be considered. The reflectance of the light-emitting panel 3 at an incident angle of 45° is calculated by the simulation. The condition of this simulation is the same as the condition of the simulation as in the case in which an incident angle is 0°. The reflectance is a ratio of intensity of light when isoenergetic white light penetrates through the color filter 36 and reaches the light-emitting panel 3 and the reflected light penetrated back through the color filter 36, to intensity of the original isoenergetic white light.

Figure 6:
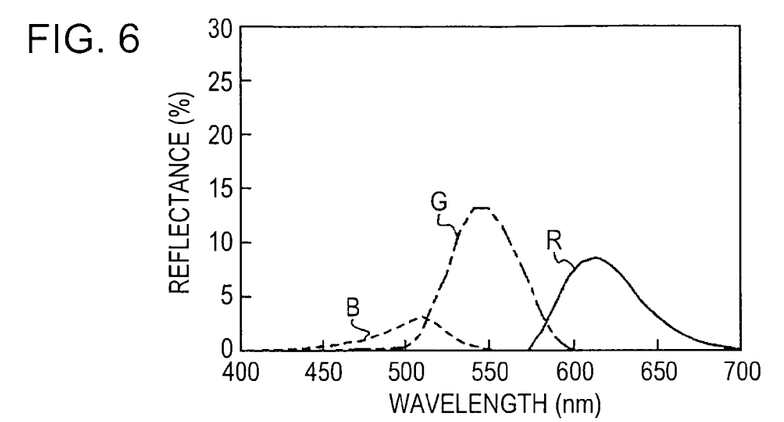
FIG. 6 is a graph illustrating the simulation result of reflectance of the light-emitting panel 3 when an incident angle is 45° in the second comparative example.

FIG. 6 is a graph showing the simulation result of the reflectance of the light-emitting panel 3 when the incident angle is 45° in the second comparative example. In FIG. 6, a curved line R shows the reflectance associated with the light-emitting element 2R and the color filter 36R, a curved line G shows the reflectance associated with the light-emitting element 2G and the color filter 36G, and a curved line B shows the reflectance associated with the light-emitting element 2B and the color filter 36B.

The luminous efficacy reflectance shown through the color filter 36 is obtained by performing integral calculus of the graph of FIG. 6 when the light is inclined to the light-emitting panel 3 at an angle of 45° (incident angle is 45°). The luminous efficacy reflectance is calculated to 4.18%. The average of the luminous efficacy reflectance at an incident angle of 0° in the second comparative example and the luminous efficacy reflectance at an incident angle of 45° in the second comparative example is 3.44%.

As described above, the second comparative example is calculated to decrease the reflectance. However, as it becomes apparent when FIG. 4 and FIG. 6 are compared with each other, at an incident angle of 45°, the reflectance associated with the light-emitting element 2R and the color filter 36R and the reflectance associated with the light-emitting element 2G and the color filter 36G are inferior to the first comparative example. The flowing is the reason.

The outdoor daylight made incident to the light-emitting panel 3 from the color filter panel 30 at an incident angle of 45° is refracted through the passivation layer 27 having a refractive index of 2, and is then made incident into the light-emitting functional layer 20 from the second electrode layer 22 at an incident angle of 20°. Accordingly, a wavelength of light made incident into the light-emitting functional layer 20 is 0.94 times a wavelength of the original outdoor daylight (the outdoor daylight penetrated through the color filter). For example, a wavelength $\lambda_R$ (610 nm) corresponding to the peak of transmittance of the outdoor daylight penetrated through the color filter 36R is shifted to 573.4 nm, a wavelength $\lambda_G$ (520 nm) is shifted to 488.4 nm, and a wavelength $\lambda_B$ (470 nm) is shifted to 441.8 nm. Accordingly, even though the reflectance of the outdoor daylight which penetrated through the color filter at the front surface (incident angle of 0°) is decreased by adjustment of the optical distance, it is not resulted in the decrease of the reflectance at an incident angle of 45° but rather led to deterioration.

As for the first comparative example and the second comparative example, power consumption needed to obtain the same luminosity and 200 candela is measured. The second comparative example is suitable for the decrease of reflectance but consumes more power than the first comparative example because the increase of light usability is not considered. As the test result, the power consumption of the second comparative example is 1.2 times the power consumption of the first comparative example.

Table 5 shows optical distances $d_1$ and $d_2$ calculated for the first comparative example and the second comparative example. In table 5, values $d_1$ obtained by expressions 9 to 11 are called $d_{1a}$ and values $d_1$ obtained by expressions 13 to 15 are called $d_{1b}$. As being apparent from table 5, $d_{1b}$ is greater than $d_{1a}$ in each of the light-emitting elements 2R, 2G, and 2B.

TABLE 5

| Calculation method | | Light-emitting element 2R | Light-emitting element 2G | Light-emitting element 2B |
|---|---|---|---|---|
| First comparative example | | | | |
| $d_1$ | Sum of products of a refractive index and a thickness | 541.620 | 468.876 | 399.750 |
| $d_1$ ($d_{1b}$) | Expressions 13 to 15 | 540.430 | 451.590 | 402.558 |
| Second comparative example | | | | |
| $d_1$ | Sum of products of a refractive index and a thickness | 500.796 | 426.324 | 399.750 |
| $d_1$ ($d_{1a}$) | Expressions 9 to 11 | 450.838 | 381.137 | 339.118 |
| Embodiment | | | | |
| $d_1$ | | 521.208 | 447.600 | 399.750 |

Simulation Result of Embodiment

The embodiment sets parameters corresponding to an intermediate value of the first comparative example and the second comparative example. In the above-described first and second comparative examples, the thickness of the first electrode layer 18R of the light-emitting element 2R and the thickness of the first electrode layer 18G of the light-emitting element 2G are different from each other. In the embodiment, the thickness of the first electrode layer 18R of the light-emitting element 2R is set to the average 97.2 nm of the first comparative example (108 nm) and the second comparative example (86.4 nm), the thickness of the first electrode layer 18G of the light-emitting element 2G is set to the average 54 nm of the first comparative example (64.8 nm) and the second comparative example (43.2 nm), and other parameters are the same in the first comparative example and the second comparative example. Table 6 shows materials and parameters of layers of the embodiment.

TABLE 6

| | | Thickness t (nm) | | | Refractive index n | | |
|---|---|---|---|---|---|---|---|
| | | Light-emitting element 2R | Light-emitting element 2G | Light-emitting element 2B | At a wavelength of $\lambda_R$ | At a wavelength of $\lambda_G$ | At a wavelength of $\lambda_B$ |
| | Material | | | | | | |
| Insulating transparent layer 14 | SiN | 90 | 90 | 90 | 1.87 | 1.88 | 1.89 |
| First electrode layer 18 | ITO | 97.2 | 54 | 27 | 1.89 | 1.97 | 2.03 |
| Light-emitting functional layer 20 | Organic light-emitting material | 94 | 94 | 94 | 1.8 | 1.83 | 1.86 |
| Second electrode layer 22 | MgAg | 12.5 | 12.5 | 12.5 | 1.232 | 1.4042 | 1.6989 |

The optical distance $d_1$ between the reflective layer 12 and the second electrode layer 22 is calculated by the sum of the product of a thickness and a refractive index of the insulating transparent layer 14, the produce of a thickness and a refractive index of the first electrode layer 18, and the product of a thickness and a refractive index of the light-emitting functional layer 20. According to this calculation, the optical distance $d_{1R}$ of the light-emitting element 2R is 521.208 nm, the optical distance $d_{1G}$ of the light-emitting element 2G is 447.600 nm, and the optical distance $d_{1B}$ of the light-emitting element 2B is 399.750 nm. These values are shown in table 5.

As being apparent from table 5, the optical distance $d_1$ ($d_{1R}$, $d_{1G}$, and $d_{1B}$) of the embodiment is an intermediate vale of the optical distance $d_1$ of the first comparative example calculated by a logical expression and the optical distance $d_{1a}$ of the second comparative example calculated by a logical expression. The optical distance $d_1$ ($d_{1R}$, $d_{1G}$, and $d_{1B}$) of the embodiment is the average of the optical distance $d_1$ calculated by the product of a refractive index and a thickness of the first comparative example and the optical distance $d_2$ calculated by the product of a refractive index and a thickness of the second comparative example.

Figure 7:
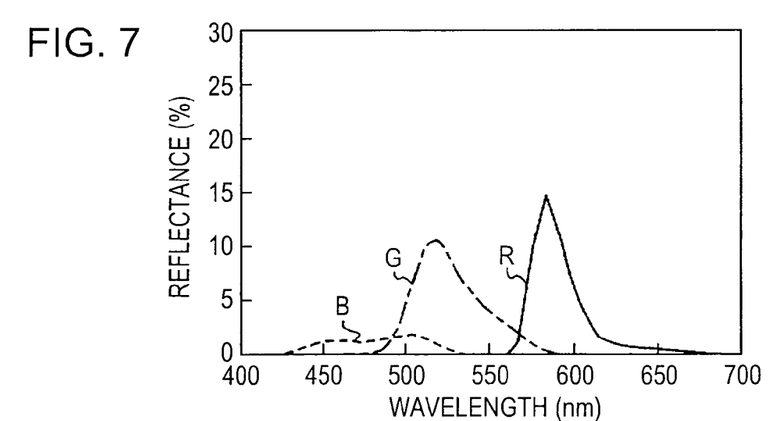
FIG. 7 is a graph illustrating the simulation result of reflectance at the front surface (incident angle is 0°) of a light-emitting panel according to one example of the first embodiment.

FIG. 7 is a graph showing the simulation result of reflectance at the front surface (incident angle is 0°) of the light-emitting panel 3 of the embodiment. In FIG. 7, a curved line R shows the reflectance associated with the light-emitting element 2R and the color filter 36R, a curved line G shows the reflectance associated with the light-emitting element 2G and the color filter 36G, and a curved line B shows the reflectance associated with the light-emitting element 2B and the color filter 36B. In this embodiment, the reflectance (curved line R) associated with the light-emitting element 2R and the color filter 36R, and the reflectance (curved line G) associated with the light-emitting element 2G and the color filter 36G are higher than the second comparative example of FIG. 5, but are decreased to the half of the first comparative example of FIG. 3.

The luminous efficacy reflectance which is a reflectance when a plurality of light-emitting elements 2 is comprehensively shown through the color filters 36 is obtained by performing integral calculus of the graph of FIG. 7 at the front surface (incident angle is 0°) of the light-emitting panel 3. The luminous efficacy reflectance is calculated to 3.54%.

When considering the outdoor daylight reflection, the reflection at various incident angles as well as the outdoor light reflected from the front surface must be considered. Accordingly, the reflectance of the light-emitting panel 3 at an incident angle of 45° is calculated by the simulation. The conditions of the simulation are set to be the same as those of the simulation in which an incident angle is 0°. When it is assumed that is energetic white light penetrates through the color filter 36 and reaches the light-emitting panel 3, the reflectance is a ratio of intensity of light which is reflected and then penetrated back through the color filter 36 to intensity of the original is energetic white light.

Figure 8:
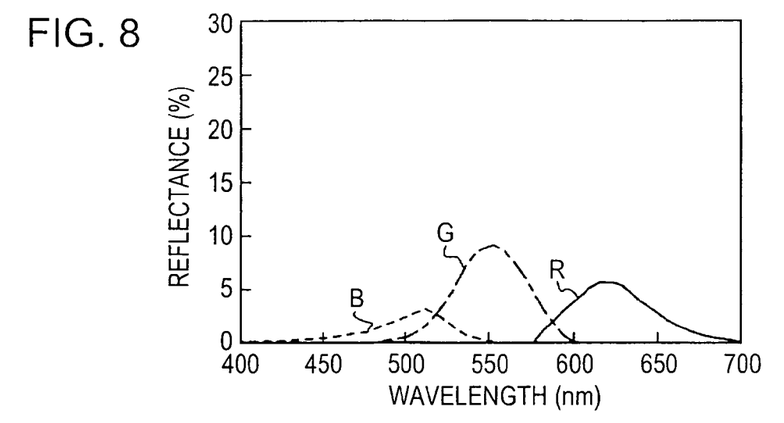
FIG. 8 is a graph illustrating the simulation result of reflectance of the light-emitting panel 3 when an incident angle is 45° in the example.

FIG. 8 is a graph illustrating the simulation result of reflectance of the light-emitting panel 3 at an incident angle of 45° of the embodiment. In FIG. 8, the curved line R shows reflectance associated with the light-emitting element 2R and the color filter 36R, the curved line G shows reflectance associated with the light-emitting element 2G and the color filter 36G, and the curved line B shows reflectance associated with the light-emitting element 2B and the color filter 36B.

The luminous efficacy reflectance through the color filter 36 is obtained by performing integral calculus of the graph of FIG. 8 when the light is inclined to the light-emitting panel 3 at an angle of 45° (incident angle of 45°). The luminous efficacy reflectance is calculated to 3.19%. From this viewpoint, the embodiment is better than the second comparative example. In the embodiment, the average of the luminous efficacy reflectance (at an incident angel of 0°) and the luminous efficacy reflectance (at an incident angle of 45°) is 3.37%, and thus the embodiment is better than the first comparative example and the second comparative example.

In this embodiment, power consumption needed to obtain the same luminosity in the first comparative example and the second comparative example and 200 candela is checked. As the checking result, the power consumption of the embodiment is 1.03 times the power consumption of the first comparative example. That is, it is possible to realize the same illumination intensity as the first comparative example with the power consumption which is almost the same as the first comparative example.

Table 7 shows performances of the first comparative example, the second comparative example, and the embodiment obtained by the simulation.

TABLE 7

|  | First comparative example | Second comparative example | Embodiment |
|---|---|---|---|
| Front surface reflectance (%) | 5.17 | 2.69 | 3.54 |
| 45° reflectance (%) | 2.55 | 4.18 | 3.19 |
| Average reflectance (%) | 3.86 | 3.435 | 3.365 |
| Power consumption ratio | 1 | 1.2 | 1.03 |

As described above, it is possible to decrease the outdoor daylight reflection and increase usability of light emitted during the light emission by setting the optical distance $d_1$ to an intermediate value between a value calculated by an expression showing conditions suited to decrease the outdoor daylight reflection and a value calculated by an expression showing conditions to increase usability of the light emitted during light emission.

In the first embodiment, the thicknesses of the first electrode layers 18 are made different according to the light-emitting elements 2R, 2G, and 2B. However, the invention is not limited to the embodiment but the thicknesses of the insulating transparent layers 14 in the light-emitting elements 2R, 2G, and 2B may be made different according to the light-emitting elements 2R, 2G, and 2B. Alternatively, it is possible to differently set the thicknesses of the light-emitting functional layers 20 according to the light-emitting elements 2R, 2G, and 2B.

Second Embodiment

Figure 9:
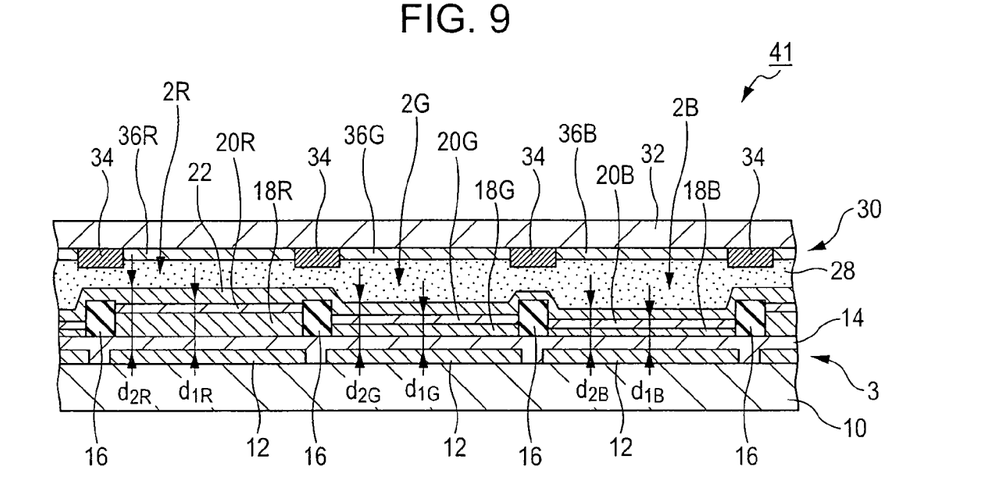
FIG. 9 is a cross-sectional view illustrating the overall structure of a light-emitting device according to a second embodiment of the invention.

FIG. 9 is a sectional view illustrating an organic EL device (light-emitting device) 41 according to a second embodiment of the invention. In FIG. 9, like elements in the first embodiment and second embodiment are referenced by like numerals and symbols. Details will be described below. In the first embodiment, the light-emitting functional layer 20 performing white emission is arranged in common in a plurality of light-emitting elements 2R, 2G, and 2B. As shown in FIG. 9, in the second embodiment, light-emitting functional layers 20R, 20G, and 20B are separately provided for the light-emitting elements 2R, 2G, and 2B, respectively. Each of the light-emitting functional layers 20R, 20G, and 20B are arranged in each of the pixel aperture of the sector 16. The light-emitting functional layer 20R emits red light, the light-emitting functional layer 20G emits green light, and the light-emitting layer 20B emits blue light.

In this embodiment, the first electrode layers 18 in the light-emitting elements 2R, 2G, and 2B are different from each other. In the same manner as the first embodiment, in order to decrease the outdoor daylight reflection and increase usability of the light having a desired wavelength, the optical distance $d_1$ between the reflective layer 12 and the second electrode layer 22 is set to a intermediate value of a value $d_1$ (called $d_{1a}$) obtained by expression 8 and a value $d_1$ (called $d_{1b}$) obtained by expression 12. Accordingly, as for the light-emitting element 2R, the optical distance $d_{1R}$ is set to be a intermediate value of a value $d_{1R}$ obtained by expression 9 and a value $d_{1R}$ obtained by expression 13. As for the light-emitting element 2G, the optical distance $d_{1G}$ is set to be a intermediate value of a value $d_{1G}$ obtained by expression 10 and a value $d_{1G}$ obtained by expression 14. As for the light-emitting element 2B, the optical distance $d_{1B}$ is set to be a intermediate value of a value $d_{1B}$ obtained by expression 11 and a value $d_{1B}$ obtained by expression 15.

As described above, since the optical distance $d_1$ is set to a value between a value calculated by an expression which shows proper condition for decreasing the outdoor daylight reflection and a value calculated by an expression which shows proper condition for increasing efficiency of light emitted during light emission, it is possible to decrease the outdoor daylight reflection and the usability of light emitted during light emission.

Figure 10:
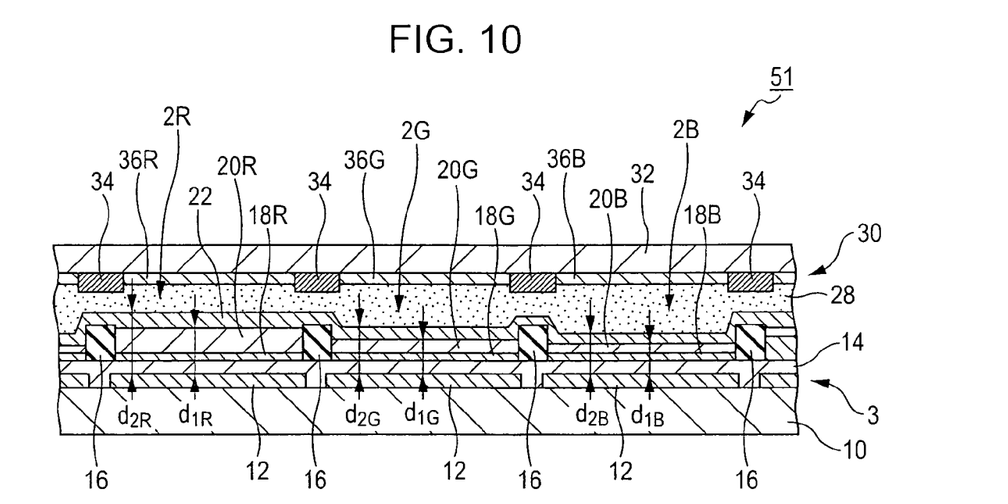
FIG. 10 is a cross-sectional view illustrating a light-emitting device according to a modification of the second embodiment of the invention.

FIG. 10 is a sectional view illustrating an organic EL device (light-emitting device) 51 according to a modified example of the second embodiment. In this modification, the optical distances $d_{1R}$, $d_{1G}$, and $d_{1B}$ are set to the intermediate values by differently setting thicknesses of the light-emitting functional layers 20R, 20G, and 20B for the light-emitting elements 2R, 2G, and 2B are different, respectively.

Figure 11:
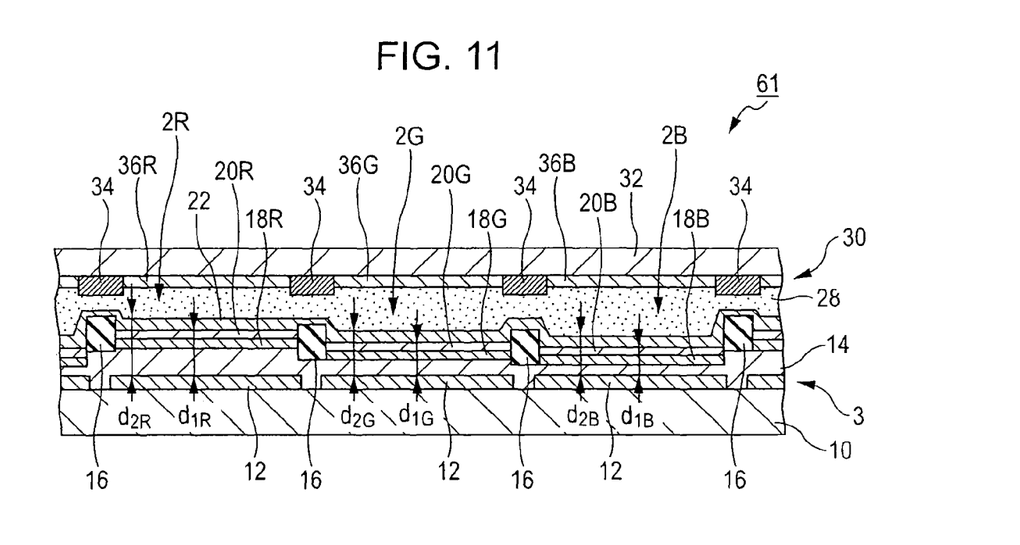
FIG. 11 is a cross-sectional view illustrating a light-emitting device according to another modification of the second embodiment.

FIG. 11 is a sectional view illustrating an organic EL device (light-emitting device) 61 according to another modified example of the second embodiment of the invention. In this modification, the optical distances $d_{1R}$, $d_{1G}$, and $d_{1B}$ are set to the intermediate values by differently setting the insulating transparent layers 14 for the light-emitting elements 2R, 2G, and 2B, respectively.

Another Modification

In the above-described embodiment, the first electrode layer 18 which is a transparent layer is a positive electrode, and the second electrode layer 22 which is a translucent layer is a negative layer. However, the first electrode layer 18 may be a negative electrode and the second electrode layer 22 may be a positive layer.

Figure 15:
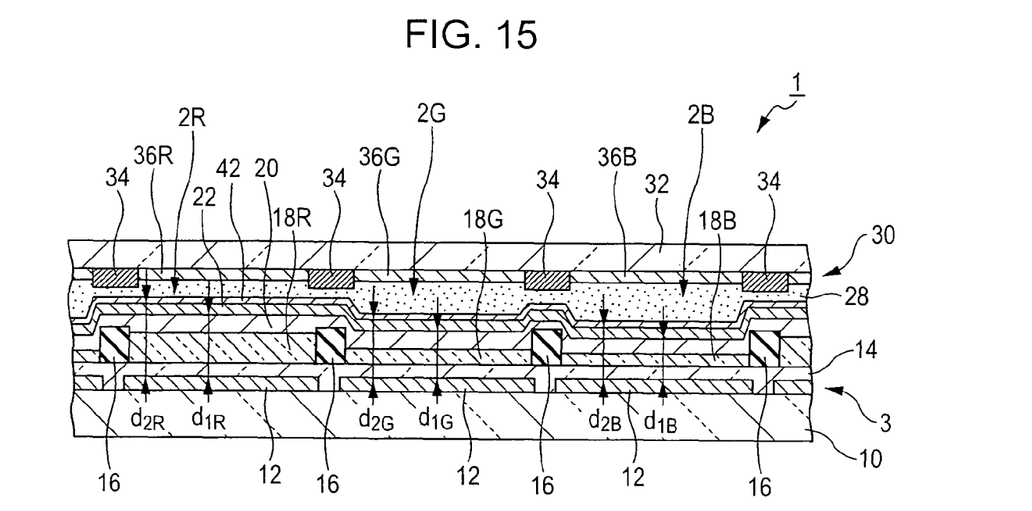
FIG. 15 is a cross-sectional view illustrating the overall structure of a light-emitting device according to a modification of the second embodiment of the invention.

In the above-described embodiment, the first electrode layer 18 and the reflective layer 12 are separate layers, but the first electrode layer 18 and the reflective layer may share a single layer In the above-described embodiment, the second electrode layer 22 is a translucent layer. However, with reference to FIG. 15, the second electrode layer 22 may be a transparent layer and a translucent layer 42 may be further provided on the opposite side of the light-emitting functional layer 20 with the second electrode layer 22 therebetween.

The light-emitting device according to the above-described embodiment is a top emission type but the light-emitting device according to the invention may be a bottom emission type. That is, the reflective layer is arranged at a location farther than the reflective layer from the substrate and the translucent layer is arranged at a location closer than the light-emitting functional layer from the substrate.

The light-emitting device according to the above-described embodiment is an organic EL device, but the light-emitting device according to the invention may be an inorganic EL device.

The optical distance $d_1$ between the reflective layer 12 and the second electrode layer 22 may be an average of a value $d_1$ (called $d_{1a}$) obtained by expression 8 and a value $d_1$ (called $d_{1b}$) obtained by expression 12. At this time, the design becomes easier.

Application

Figure 12:
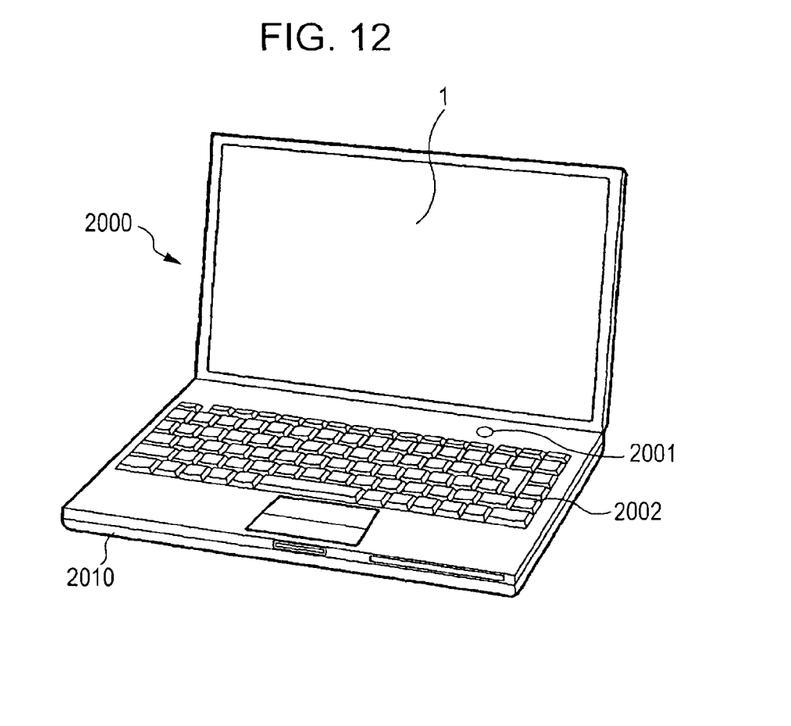
FIG. 12 is a perspective view illustrating an electronic apparatus to which an organic EL device according to the invention is applied.

Next, an electronic apparatus to which the organic EL device according to the invention is applied will be described. FIG. 12 is a perspective view illustrating the structure of a mobile-type personal computer which is an image displaying apparatus employing a light-emitting device according to this embodiment. The personal computer 2000 includes an organic EL device 1 serving as a displaying device and a main body part 2010. A power switch 2001 and a keyboard 2002 are installed in the main body part 2010.

Figure 13:
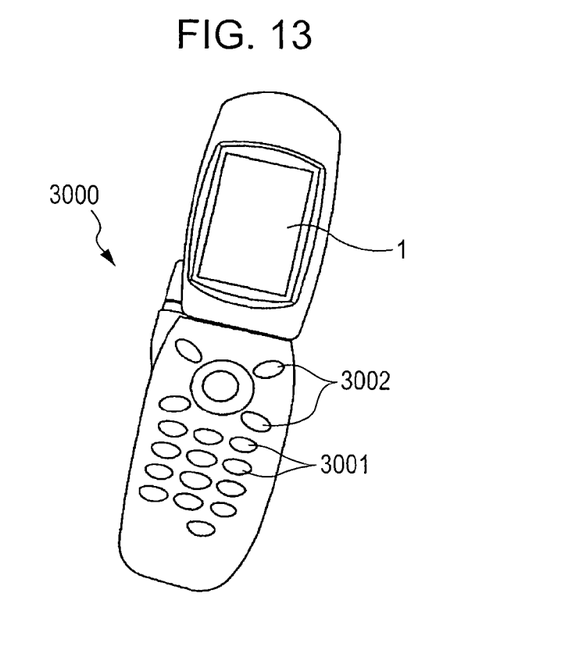
FIG. 13 is a perspective view illustrating another electronic apparatus to which the light-emitting (EL) device according to the invention is applied.

FIG. 13 shows a cellular phone to which the light-emitting device according to the above-described embodiment is applied. The cellular phone 3000 includes a plurality of manipulation buttons 3001, a scroll button 3002, and an organic EL device 1 serving as a displaying device. An image displayed on the organic EL device 1 is scrolled by manipulating the scroll button 3002.

Figure 14:
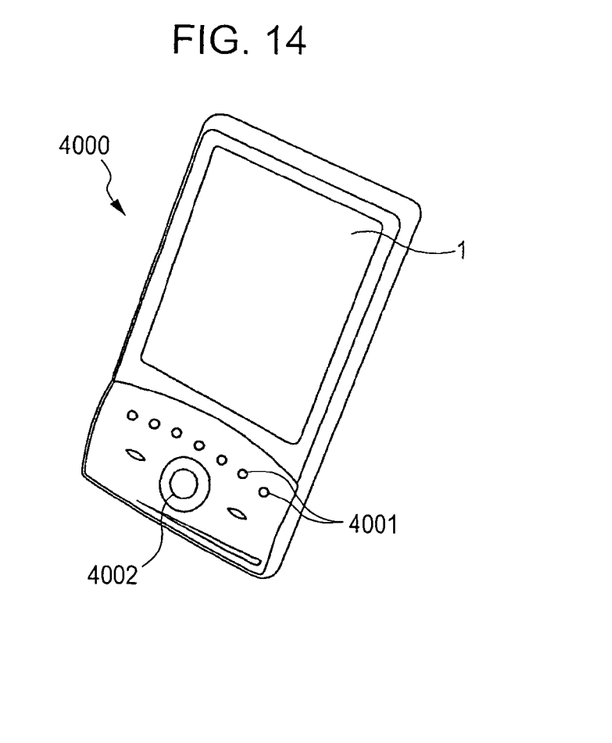
FIG. 14 is a perspective view illustrating a further electronic apparatus to which the light-emitting (EL) device according to the invention is applied.

FIG. 14 shows a personal digital assistant (PDA) to which the light-emitting device according to the above-described embodiment is applied. The PDA 4000 includes a plurality of manipulation buttons 4001, a power switch 4002, and an organic EL device 1 serving as a displaying device. Various information such as address and schedule organizer is displayed on the organic EL device 1 by manipulating the power switch 4002.

Besides the electronic apparatuses to which the organic EL device is applied, shown in FIGS. 12 to 14, there are many other electronic apparatuses such as a digital camera, a television, a video camera, a car navigation device, a pager, an electronic organizer, electronic paper, a calculator, a word processor, a workstation, a video conferencing telephone, a point-of-sale (POS) terminal, a vide player, and an apparatus equipped with a touch panel.

What is claimed is:

1. A light-emitting device comprising:
   a light-emitting element having a substrate, a first electrode layer, a translucent semi-reflective layer, and a light-emitting functional layer disposed between the first electrode and the translucent semi-reflective layer;
   a reflective layer between the substrate and the first electrode; and
   a color filter which is disposed at the opposite side of the light-emitting functional layer with the translucent semi-reflective layer therebetween and transmits light which passed through out the translucent reflective layer,
   wherein an optical path $d_1$ which is a way from the reflective layer to the translucent semi-reflective layer is a value between $d_{1a}$ calculated by expression 1 and $d_{1b}$ calculated by expression 2,
   wherein $d_{1a}=(p+1/2)\cdot\lambda/2-(\phi_1-\phi_2)\cdot\lambda/4\pi-n_z\cdot t_z$ (expression 1), and $d_{1b}=m\cdot\lambda/2+(\phi_3+\phi_2)\cdot\lambda/4\pi$ (Expression 2),
   wherein $\lambda$ is a wavelength at a peak transmittance of the color filter, $\phi_1$ is a phase change when light of a wavelength $\lambda$, which advances toward the translucent semi-reflective layer from the opposite side of the light-emitting functional layer, reflects from an interface of the translucent semi-reflective layer, which is at the opposite side of the light-emitting functional layer, $\phi_2$ is a phase change when the light of a wavelength $\lambda$, which advances toward the reflective layer from the light-emitting functional layer, reflects from the reflective layer, and $\phi_3$ is a phase change when the light of a wavelength $\lambda$, which advances toward the translucent semi-reflective layer from the light-emitting functional layer, reflects from the interface of the translucent semi-reflective layer which is at the opposite side of light-emitting functional layer side wherein p is a positive integer, m is a positive integer, $n_z$ is a reflectance of the translucent semi-reflective layer with respect to the light of a wavelength $\lambda$ and $t_z$ is a thickness of the translucent semi-reflective layer.

2. The light-emitting device according to claim 1, wherein the translucent semi-reflective layer serves as a second electrode opposite from the first electrode with the light-emitting functional layer disposed therebetween.

3. The light-emitting device according to claim 1, further comprising a second electrode between the translucent semi-reflective layer and the light-emitting functional layer.

4. The light-emitting device according to claim 1, wherein the optical path $d_1$, which is a way from the reflective layer to the translucent semi-reflective layer, is an average value of $d_{1a}$ calculated by the expression 1 and $d_{1b}$ calculated by the expression 2.

5. The light-emitting device according to claim 1,
   further comprising a plurality of light-emitting elements which allows different colors of light to pass through the translucent semi-reflective layer thereof; and
   a plurality of the color filters having different peak transmitting wavelengths $\lambda$ of light,
   wherein each of the color filters is disposed to correspond to any of the plurality of light-emitting elements and constitutes one set of a color filter and a light-emitting element,
   wherein in each set of a color filter and a light-emitting element, the optical path $d_1$, which is a way from the reflective layer to the translucent semi-reflective layer, is a value between $d_{1a}$ calculated by the expression 1 and $d_{1b}$ calculated by the expression 2.

6. An electronic apparatus comprising the light-emitting element according to claim 1.

7. The light-emitting device according to claim 1, wherein m has a value of 1.

8. The light-emitting device according to claim 1, wherein p has a value of 1.

9. The light-emitting device according to claim 1, wherein m and p each have a value of 1.

* * * * *